Aug. 9, 1960 B. N. LOCANTHI ET AL 2,948,841
TRANSISTOR POWER SUPPLY
Filed April 21, 1958
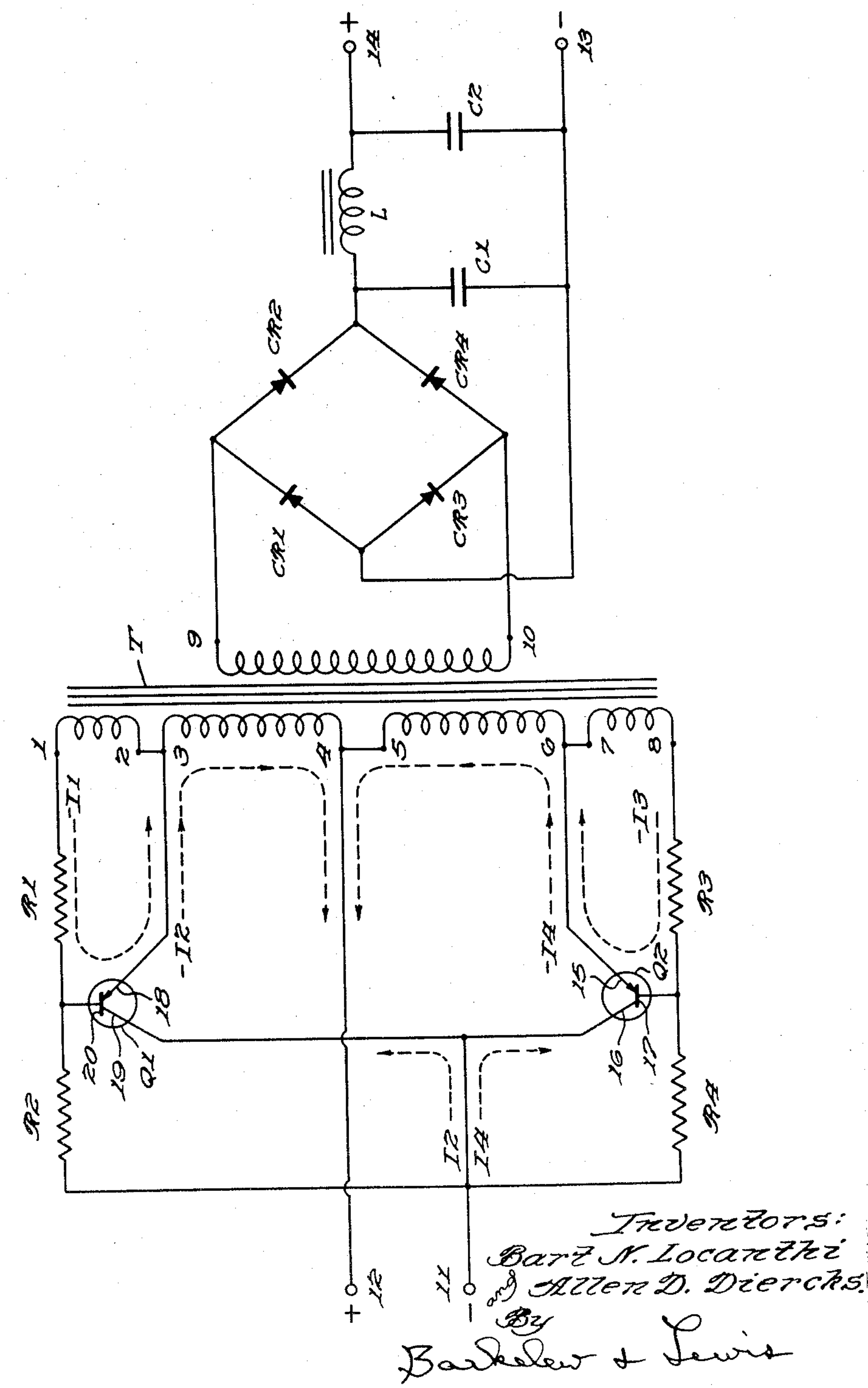
Inventors:
Bart N. Locanthi
and Allen D. Dierchs.
By
Barkelew & Lewis 2,948,841
Patented Aug. 9, 1960

2,948,841

TRANSISTOR POWER SUPPLY

Bart N. Locanthi and Allen D. Diercks, Altadena, Calif., assignors to Computer Engineering Associates, Inc., Pasadena, Calif., a corporation of California Filed Apr. 21, 1958, Ser. No. 729,780

3 Claims. (Cl. 321—2)

This invention relates to an improved transistor power supply such as used, for example, to change a low level D.C. voltage into a high level D.C. voltage. More generally, the invention relates to an electrical circuit which contains a transistor oscillator with a rectifier coupled to the oscillator output and a load connected to the rectifier output. The invention is useful in improving the oscillator action in such a circuit by increasing the oscillator's reliability of starting without adversely affecting the other circuit characteristics.

Because of characteristics inherent in transistors, self biased transistor oscillators have a poor reliability of starting. For example, when voltage is initially applied to the transistor elements a current flow will not always result between the emitter and collector of the transistor. Without an initial current flow the oscillatory action of the circuit cannot begin, and the circuit may therefore be inoperative even though input voltage is applied. It has been found that provision of suitable fixed bias voltages between the emitter and the base and between the collector and the base will increase the reliability of starting. However, even with a fixed bias supplied, the reliability of starting may be poor if there is an appreciable load on the circuit. In fact, with a given oscillator circuit supplied with a starting bias, it is possible to increase the load to a point where the oscillator fails to start, although it will remain operative if it has previously started. Furthermore, it is possible to increase the load beyond this point to a point where the oscillator will cease oscillating even if it has previously been started.

The starting problem is particularly important when the oscillator is used in a D.C. power supply in connection with a rectifier and filter. In order to adequately filter the output of the rectifier it is necessary to place filter capacitance in shunt with the load, the size of the capacitance being determined by the amount of filtering desired. The larger the capacitance, the smaller the amount of ripple in the rectifier output. Since the impedance of a capacitance to a rapid change of voltage is quite low, and decreases with increasing value of the capacitance, the filter capacitance acts as a heavy load on the circuit during the starting time of the oscillator, thus decreasing the reliability of starting. In general, an increase in the size of the filter capacitance improves the quality of the output voltage by decreasing ripple content, but degrades the overall circuit action by decreasing the reliability of starting in the oscillator.

Furthermore, in a D.C. power supply using a transistor oscillator in connection with a rectifier, there is often no practical way of reducing ripple content in the output except through use of a capacitance filter. Inductive filters are used in other applications, but they have severe disadvantages when used in this type of circuit. Transistor power supplies are generally used in applications where weight, size, and efficiency are the primary factors; for example, in missiles, satellites, aircraft, and the like. Filter inductors are large, heavy, and inefficient compared to capacitors. For equivalent filtering in an illustrative power supply providing 0.5 ampere at 200 volts, for example, an inductive filter would be in the order of 100 times heavier than a capacitive filter, 20 times larger, but only 1% as efficient. In addition, an inductive filter may induce ringing oscillations which degrade the circuit performance.

A further disadvantage of the inductive filter is that the inductance must be placed in series with the load, and therefore adds to the internal impedance of the power supply, usually quite significantly. This is a severe disadvantage in many applications which require a low impedance voltage source. The higher the impedance of a voltage source, the greater will be its variation in output voltage with a given change in output current, so that the source impedance becomes a primary factor in applications which require a relatively stable voltage under unstable current conditions. Thus it can be seen that a serious conflict exists between the requirements of output filtering and reliability of starting in a circuit of the above mentioned type, and the primary object of this invention is to provide convenient and economical means of increasing the reliability of starting which do not substantially increase percentage of ripple.

An additional feature of the invention involves a novel and improved bias network for an RL-type transistor multivibrator. Such a multivibrator requires fixed biases to increase reliability of starting, for the reasons discussed above, quite aside from any load considerations. When the multivibrator must be driven from a two terminal source, as is quite often the case, the bias networks previously used have been found to have serious disadvantages. Therefore an additional object of the invention is to provide an improved starting bias network for RL-type multivibrators, which avoids the disadvantages of previous starting bias networks.

These and other objects and advantages of the invention will be apparent to those skilled in the art from the following description of an illustrative embodiment thereof, in connection with the attached drawing.

The single figure is a schematic diagram of an illustrative embodiment of the invention.

The circuit disclosed in the figure is a power supply unit which has an input voltage of 26 volts D.C. between terminals 11 and 12, and an output voltage of 200 volts D.C. between terminals 13 and 14. The operation of the circuit, broadly described, is as follows: the 26 volt D.C. input power drives an RL-type transistor multivibrator, which produces a square alternating current output voltage. The square wave A.C. output of the multivibrator is coupled through the transformer T, which has a suitable voltage step up ratio, to a bridge rectifier (diodes CR1, 2, 3, and 4), which changes the A.C. voltage into pulsating D.C. voltage. The rectifier output is filtered by a filter network (L, C1, and C2) which reduces the ripple content in the output to the required level, providing a relatively smooth D.C. output voltage of 200 volts D.C. between terminals 13 and 14.

The oscillator portion of the circuit comprises the transformer T, power transistors Q1 and Q2, power input terminals 11 and 12, and bias resistors R1, R2, R3, and R4. The oscillator circuit is similar to RL-type multivibrators previously known in the art, except in the novel arrangement of the bias resistor network, and its relation to the circuit operation. For convenience of description the operation of the conventional portions of the oscillator will be described first, without reference to the bias circuit.

Transistors Q1 and Q2 are identical PNP junction power transistors connected with common emitters as a symmetrical push-pull amplifier with a power gain larger than 1. It will be understood by those skilled in the art that a gain in excess of 1 is required for oscillation. The input electron current for both transistors is injected into their respective bases from voltages developed in the associated transformer feedback windings; winding 1—2 for transistor Q1, and winding 7—8 for transistor Q2. The input electron current —I1 of Q1, which is opposite to the conventional current I1, flows from transformer terminal 1 through resistor R1 to the base 20 of Q1, thence through the emitter 18 back to terminal 2. The output electron current —I2 of Q1 flows from terminal 11 of the source through the collector 19 and emitter 18 of Q1, thence through load winding 3—4 in the direction indicated, and back to terminal 12 of the source. The input electron current —I3 and output electron current —I4 of Q2 follow similar paths, as indicated by their dotted arrows in the figure. Load windings 3—4 and 5—6 are substantially identical, so that the circuit between terminals 3 and 6 constitutes a center tapped output winding common to both transistor circuits. Feedback windings 1—2 and 7—8 provide the feedback voltage required for oscillation.

The voltages developed in feedback windings 1—2 and 7—8 are derived from a change in load currents I2 or I4 by magnetic coupling. An increase in I2 induces a voltage in feedback winding 1—2 in the direction of I1, a voltage in winding 5—6 against the direction of I4, and a voltage in winding 7—8 against the direction of I3. When the current I2 is constant, it induces no voltages in the other windings, and when I2 decreases the polarity of the induced voltages reverses. In the same manner, an increase in I4 induces voltages aiding I3 and opposing I1 and I2; and a decrease in I4 induces voltages opposing I3 but aiding I1 and I2.

And, since the transistors have a power gain greater than unity, an increase in either input circuit causes a greater increase in the corresponding output circuit, and a decrease in either input circuit causes a greater decrease in the corresponding output circuit. Thus it can be seen that there is regenerative feedback between the input and output circuit of each transistor. And, since input current against the direction of I1 and I3 cuts the associated transistor off, it can also be seen that there is degenerative feedback between the input circuit of one transistor and the output circuit of the other.

The relationships described above cause a rapid periodic switching of conduction from one transistor to the other in the following manner: assuming that the transistors will conduct when input voltage is applied, the application of voltage between terminals 11 and 12 tends to cause both Q1 and Q2 to conduct. However, one of the transistors will dominate the circuit initially by beginning conduction either sooner or more heavily than the other. Assume Q1 dominates initially. I2 then begins to flow, inducing a regenerative voltage in winding 1—2 and a degenerative voltage in winding 7—8. The degenerative voltage cuts Q2 off, and the regenerative voltage causes a further increase in I2, which causes additional regenerative and degenerative voltages, and so on. This cumulative process very rapidly drives Q1 into saturation and Q2 into cut-off. The build up process ends when the core of the transformer becomes saturated. When the core becomes saturated the amount of regenerative voltage induced in winding 1—2 for an increment of increase in I2 drops to a low value, causing a decrease in the input current I1. This in turn causes a decrease in I2, reversing the polarity of all induced voltages, starting a reverse cumulative process which drives Q1 toward cut-off and Q2 toward conduction. When Q2 begins to conduct it then dominates the circuit and goes through a similar cumulative cycle which reverses when the transformer core saturates in the other direction. The output cycle of each transistor produces an approximate square wave of voltage substantially equal to the supply voltage across its associated load winding, and since the output currents of the two transistors flow in different directions relative to the core of the transformer, the net result between terminals 3 and 6 is an A.C. square wave with a peak to peak amplitude of twice the input voltage.

The bias network, which comprises the inventive portion of the oscillator circuit, has resistors R1 and R3 connected in series with the base input of Q1 and Q2, respectively, and resistors R2 and R4 connected between the base and collector of Q1 and Q2, respectively. The bias resistors have functions associated with both transistor starting and with the ordinary operation of the multivibrator. In the ordinary operation of the multivibrator, resistors R1 and R3 act as input current limiting resistors, protecting their respective transistors against damage from excess current input. Current limiting resistors are necessary in this type of circuit because of the low impedance input sources, windings 1—2 and 7—8.

Resistors R2 and R4 also serve necessary functions in the operation of the multivibrator aside from starting considerations. In order for a transistor to operate as an amplifier it is necessary to have a reverse bias between its collector and base and a forward bias between its emitter and base. Resistors R2 and R4 provide the required bias to the transistor elements through a voltage divider extending from terminal 11 through the feedback and load windings to terminal 12.

It should be noted at this point that the bias voltages across resistors R2 and R4 depend upon the conduction state of their respective transistors. Referring to R2, when Q1 is cut off its collector-emitter path is virtually an open circuit, and a voltage equal to twice the input voltage appears across R1 and R2 from the addition of the source voltage and an equal induced voltage of the same polarity in load winding 3—4. But when Q1 conducts, its collector-emitter path is substantially a short circuit across the series combination of input voltage and load winding 3—4. In that case the only voltage appearing across R2 is the very small internal voltage drop between the base and collector of the transistor, and the voltage appearing across R1 is the series combination of the small voltage drop between the base and emitter with the feedback voltage induced in winding 1—2. Thus as the transistors switch between conduction and cut-off the voltage appearing across the series combination R1, R2 switches from twice the input voltage to a small value.

In the role of providing starting bias the resistor networks operate as follows: when voltage is initially applied between terminals 11 and 12 neither transistor is conducting, hence their collector-emitter paths form virtually open circuits. The applied voltage is then distributed around the voltage divider circuits comprising the resistors in series with their associated feed-back and load windings. The voltage drops across the resistors supply the required biases to the transistors, a reverse bias between the collector and base, and a forward bias between emitter and base. These biases will insure starting of the circuit, provided it is not too heavily loaded in its output circuit.

The A.C. square wave output of the multivibrator is coupled to the secondary winding 9—10 of the transformer, which has a voltage step up ratio. The secondary output voltage is rectified by a bridge rectifier comprising diodes CR1, CR2, CR3, and CR4. The operation of this portion of the circuit will not be discussed herein since it is well understood by those skilled in the art. The pulsating D.C. output of the bridge rectifier is applied to a filter inductance comprising L, C1, and C2. The filter appears to be a pi-section inductive filter, but it differs markedly from a pi-section filter in the relationship of the impedance magnitudes to each other and to the output characteristics of the circuit.

The inductor L is small, and has a core which saturates below the normal output current of the power supply. When the core is unsaturated, the inductance is maximum, but when the core becomes saturated the inductance falls to a relatively low value. A primary function of L is to provide a buffer between the main filter capacitor C2 and the oscillator during the time when current is beginning to flow in the circuit, i.e., during start time. During start time the relatively high impedance of L isolates the shorting effect of the main filter capacitor C2 from the oscillator circuit, thus increasing reliability of starting. When the oscillator circuit is started, the output current builds up toward its normal level, saturating the core of the inductance. Such saturation may typically occur at from about 1/20 to about 3/4 of the normal output current of the system. When the core saturates the inductance drops to a relatively low value, which reduces the choke's effect in the circuit.

Since the inductance functions primarily as a buffer during start time, and only secondarily contributes to filtering action, it is possible to avoid the disadvantages mentioned previously which arise from use of an inductive filter. The amount of iron in the core can be made quite small, since it may saturate at very low current levels without any degradation of the buffer action. By the time the output current has risen to a small fraction of its normal value, the circuit is started, and the inductance has fulfilled its primary function. Also, since the filtering is accomplished primarily by capacitor C2, the saturated value of the inductance can be small. This reduces the possibility of ringing oscillations in the inductor, and reduces inductor losses. Also, since the inductor impedance is relatively low when saturated, it does not add excessively to the source impedance. Core and resistive losses are also low, as are weight and size.

Capacitor C1 is small relative to C2; its primary function being to hold current through the inductance above the core saturation level between the end of one output pulse from the rectifier and the beginning of the next. C1 also limits negative spikes of voltage in the reverse direction across the rectifier diodes and improves filtering. During one of the square output pulses from the rectifier, electron current flows from left to right through the inductor from the diodes, and C1 becomes charged to the voltage level at the diode output. At the end of the pulse the voltage applied through the diodes very rapidly falls to zero, and the diodes momentarily become non-conducting. The charge on C1 then discharges through the inductance, maintaining the current flow until the beginning of the next input pulse. The inductance, of course, tends to maintain its own current flow when voltage is removed, entirely apart from the action of capacitor C1. However, if capacitor C1 were not in the circuit the inductance would have to draw its current around the high impedance loop comprising C2 in series with the back impedance of the bridge, and its current would therefore drop quite low between pulses. C1 functions both as a source of potential between pulses and also as a short circuit around the high back impedance of the bridge.

The exact values of components in the circuit cannot be specified except in reference to a specific set of performance requirements, since the exact values chosen will obviously depend on the application. But the design of circuits of this general type to fit different applications is well known to those skilled in the art, and given a set of performance requirements suitable values for the components can readily be determined by those skilled in the art. However, it may be helpful to indicate some of the general design factors involved in the inventive portions of the circuit.

In the bias resistor networks, current limiting resistors R1 and R3 are chosen to limit current input to a safe level with maximum voltage at the feedback windings. In the instant embodiment of the invention, which employes Delco 2N174 transistors and a maximum feedback of 5.2 volts, a value of 22 ohms was found to be appropriate. Resistors R2 and R4 are preferably made as large as possible to minimize power loss in the bias networks; however they must not be made so large that the forward bias across R1 and R3 falls below the level that gives reliable starting. In the instant embodiment, which has an input supply of 26 volts, a value of 1800 ohms was found appropriate.

The transformer is preferably of the high remanence core type, with substantially square loop magnetic characteristics, and with very tight coupling between the windings. The two emitter windings 3—4 and 5—6 are preferably bifilar wound with each other, as are the two feedback windings 1—2 and 7—8. The feedback windings are generally small compared to the emitter windings, typically requiring only one fifth as many turns as the latter.

In the filter circuit, the filter capacitor C2 is chosen in accordance with the amount of filtering required in the output; the larger the capacitance the better the filtering action. In the present embodiment 24 microfarads are used. The inductor is chosen with an unsaturated inductance sufficiently large to effectively isolate C2 during start time, and with a core which saturates at less than the normal output current. The nominal output current of the instant embodiment is 0.5 ampere, and the inductor employed therein saturates at 300 ma., having an unsaturated inductance of 20 millihenrys and a saturated inductance of 10 millihenrys. Capacitor C1 is chosen large enough to maintain current through the choke above saturation level between pulses, yet small enough to avoid materially loading the rectifier output during start time. Suitable values for C1 are ordinarily between about 2% and about 10% of C2. In the instant embodiment 0.5 microfarad was found appropriate.

The instant embodiment employs PNP transistors connected with common collectors; however it will be understood by those skilled in the art that the circuit might instead have the transistors connected with common emitters, or might employ NPN transistors connected with either common emitters or common collectors, without affecting the fundamental operation of the circuit. The circuit changes required for the above mentioned modifications are well understood in the art.

Thus, although this invention has been illustrated by reference to one specific embodiment thereof, it will be understood that many modifications are possible which do not depart from the spirit of the invention. The invention includes all subject matter falling within the scope of the following claims.

We claim:

1. In an electrical circuit containing a transistor oscillator, a rectifier coupled to the output of the oscillator and a capacitance in parallel with the output of the rectifier; the improvement comprising an inductor connected in series with the output of the rectifier between the capacitance and the rectifier, said inductor having a saturable core which saturates with a value of current flow therethrough less than the normal output current of the rectifier, and a second capacitance connected in parallel with the output of the rectifier between the inductor and the rectifier, said second capacitance having a small capacity relative to the capacity of the first said capacitance.

2. A multivibrator power supply comprising a positive and a negative power input terminal, a transformer having two load windings and two feedback windings, the positive input terminal being connected to one end of both load windings, the other end of each load winding being connected to one end of a feedback winding, the junction between each load winding and its associated feedback winding being connected to the emitter of a PNP transistor, a resistor connected in series between the other end of each feedback winding and the base of its associated transistor, another resistor connected in series between the base of each transistor and the negative power input terminal, the collector of each transistor being connected to the negative power input terminal, a secondary winding on said transformer, a rectifier connected to the secondary winding, a capacitance in parallel with the output of the rectifier, an inductor connected in series with the output of the rectifier between the capacitance and the rectifier, said inductor having a saturable core which saturates with a value of current flow therethrough less than the normal output current of the rectifier, and a second capacitance connected in parallel with the output of the rectifier between the inductor and the rectifier, said second capacitance having a capacity that is small relative to the capacity of the first said capacitance.

3. In an electrical circuit containing a transistor oscillator, a rectifier coupled to the output of the oscillator and a capacitance in parallel with the output of the rectifier: the improvement comprising an inductor connected in series with the output of the rectifier between the capacitance and the rectifier, the inductance of said inductor, at currents small compared to the normal output current of the rectifier, being sufficient to effectively isolate the capacitance during starting of the oscillator, and a second capacitance connected in parallel with the output of the rectifier between the inductor and the rectifier, said second capacitance having a capacity between about 2 and about 10% of that of the first said capacitance.

References Cited in the file of this patent

UNITED STATES PATENTS

| | | |
|---|---|---|
| 1,897,249 | Fleming | Feb. 14, 1933 |
| 1,972,529 | Longoria | Sept. 4, 1934 |
| 2,710,938 | Lee | June 14, 1955 |
| 2,837,651 | Shultz | June 3, 1958 |
| 2,852,730 | Magnuski | Sept. 16, 1958 |
| 2,874,293 | McMurren | Feb. 17, 1959 |
| 2,896,146 | Jenkins | July 21, 1959 |